(12) United States Patent
Moriwaki et al.

(10) Patent No.: US 8,896,775 B2
(45) Date of Patent: Nov. 25, 2014

(54) ELECTRO-OPTICAL DEVICE AND ELECTRONIC APPARATUS

(75) Inventors: Minoru Moriwaki, Nagano-ken (JP); Masahiro Yasukawa, Chino (JP); Ken Wakita, Nagano-ken (JP)

(73) Assignee: Seiko Epson Corporation, Tokyo (JP)

( * ) Notice: Subject to any disclaimer, the term of this patent is extended or adjusted under 35 U.S.C. 154(b) by 127 days.

(21) Appl. No.: 13/042,595

(22) Filed: Mar. 8, 2011

(65) Prior Publication Data

US 2011/0222008 A1    Sep. 15, 2011

(30) Foreign Application Priority Data

Mar. 10, 2010   (JP) .................................. 2010-052938

(51) Int. Cl.
| | |
|---|---|
| *G02F 1/1343* | (2006.01) |
| *G02F 1/136* | (2006.01) |
| *G02F 1/1362* | (2006.01) |
| *H01L 27/12* | (2006.01) |
| *H01L 27/13* | (2006.01) |
| *H01L 29/786* | (2006.01) |

(52) U.S. Cl.
CPC ................ *H01L 27/12* (2013.01); *H01L 27/13* (2013.01); *G02F 1/136209* (2013.01); *H01L 27/1214* (2013.01); *H01L 29/78633* (2013.01); *G02F 1/136213* (2013.01); *G02F 1/136227* (2013.01)
USPC ................ 349/38; 349/42; 349/44

(58) Field of Classification Search
USPC ..................................................... 349/38–43
See application file for complete search history.

(56) References Cited

U.S. PATENT DOCUMENTS

| | | | |
|---|---|---|---|
| 7,403,237 B2 * | 7/2008 | Iki .................................... | 349/43 |
| 7,808,009 B2 * | 10/2010 | Hirakata et al. ................ | 257/83 |
| 8,111,340 B2 * | 2/2012 | Yamashita et al. .............. | 349/39 |
| 2003/0234971 A1 | 12/2003 | Murade | |
| 2005/0046761 A1 | 3/2005 | Fukuhara et al. | |
| 2005/0285988 A1 * | 12/2005 | Nakagawa ....................... | 349/44 |
| 2009/0040447 A1 * | 2/2009 | Nakagawa .................... | 349/139 |
| 2010/0033645 A1 * | 2/2010 | Nakagawa ....................... | 349/43 |
| 2011/0222008 A1 * | 9/2011 | Moriwaki et al. ............ | 349/138 |

FOREIGN PATENT DOCUMENTS

| | | |
|---|---|---|
| JP | 2001356709 A | 12/2001 |
| JP | 2003337553 A | 11/2003 |
| JP | 2005-055661 | 3/2005 |
| JP | 2008198692 A | 8/2008 |

* cited by examiner

*Primary Examiner* — Dung Nguyen
(74) *Attorney, Agent, or Firm* — Lowe Hauptman & Ham, LLP

(57) ABSTRACT

An electro-optical device includes a pixel electrode provided on a substrate, a transistor provided between the substrate and the pixel electrode, a first capacitor electrode provided between the pixel electrode and the transistor, and be electrically connected to the pixel electrode and the transistor, a second capacitor electrode provided between the pixel electrode and the first capacitor electrode, be located so as to be opposite the first capacitor electrode via a capacitor insulating film, and be supplied with a predetermined electric potential, and a light-shielding film provided between the pixel electrode and the second capacitor electrode, be located so as to be at least partially overlapped by the transistor, and be electrically connected to the second capacitor electrode via a contact hole formed in an insulating film disposed between the second capacitor electrode and the light-shielding film.

9 Claims, 11 Drawing Sheets

OXIDATION PROCESS

CONTACT HOLE FORMATION

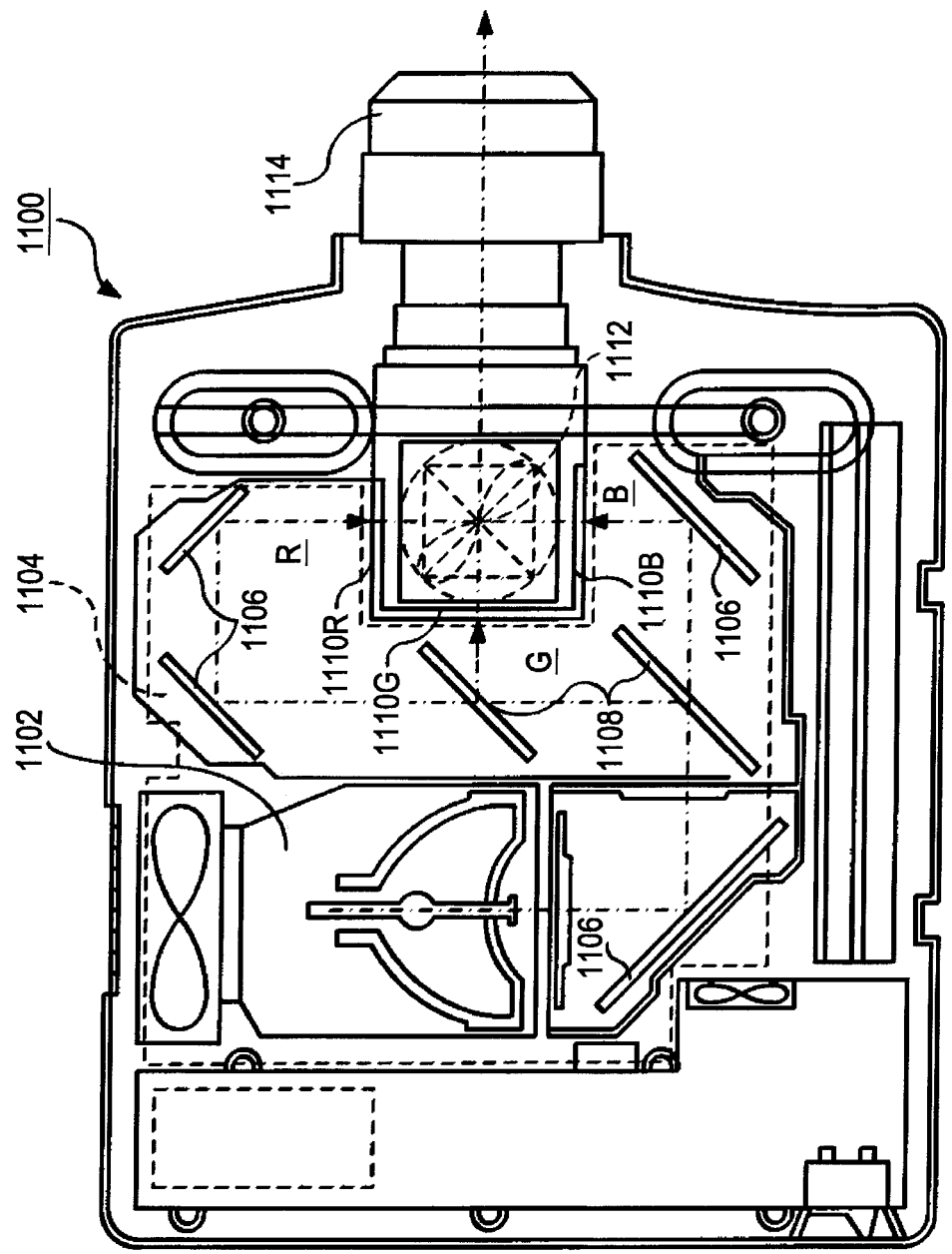

ELECTRO-OPTICAL DEVICE AND ELECTRONIC APPARATUS

BACKGROUND

1. Technical Field

The present invention relates to an electro-optical device, such as a liquid crystal device, an electronic apparatus including the electro-optical device, such as a liquid crystal projector.

2. Related Art

As this kind of an electro-optical device, there is an electro-optical device of active matrix drive type, which includes, for example, on a substrate thereof, pixel electrodes, scanning lines for selectively driving the pixel electrodes, data lines, and pixel switching thin-film transistors (TFTs). The switching elements, such as TFTs, and various wirings are formed on the substrate as a laminated structure.

In such an electro-optical device described above, by forming storage capacitors in the laminated stricture, reduction of occurrences of black unevenness (i.e., enhancement of contrast characteristics) with respect to displayed images and prevention of shortening a life span for pixels are intended. For example, in JP-A-2005-55661, a technology, which enables realization of a storage capacitor having a superior pressure-withstanding capability by allocating two electrodes, each including an oxidized film, so that the two electrodes can be opposite each other via a dielectric film, has been proposed.

With respect to a TFT used as a switching element, for example, during an operation of a device, light rays radiating from a light source are inputted to the device owing to reflections thereof and the like, so that an optical leakage current occurs. Since the optical leakage current is likely to be a cause of defects of the device, it is desirable to enhance a capability of optically shielding the TFT to the maximum extent possible.

However, the technology according to JP-A-2005-55661 is not sufficient because layers existing at the upper layer side of the TFT are electrode layers each having an oxidized film, which form the storage capacitor. That is, in the above-described technology, there exists a technical disadvantage in that it is difficult to certainly prevent occurrences of the optical leakage current with respect to the TFT.

SUMMARY

An advantage of the invention is to provide an electro-optical device, having high-density storage capacitors, and further, being capable of realizing a capability of optically shielding TFTs, an electronic apparatus including the electro-optical device, and a manufacturing method for manufacturing the electro-optical device.

An electro-optical device according to a first aspect of the invention includes a pixel electrode configured to be provided at the pixel on the substrate, a transistor configured to be provided between the substrate and the pixel electrode, a first capacitor electrode configured to be provided between the pixel electrode and the transistor, and be electrically connected to the pixel electrode and the transistor, a second capacitor electrode configured to be provided between the pixel electrode and the first capacitor electrode, be located so as to be opposite the first capacitor electrode via a capacitor insulating film, and be supplied with a predetermined electric potential, and a light-shielding film configured to be provided between the pixel electrode and the second capacitor electrode, be located so as to be at least partially overlapped by the transistor, and be electrically connected to the second capacitor electrode via a contact hole formed in an insulating film disposed between the second capacitor electrode and the light-shielding film.

An electro-optical device according to the first aspect is configured to, for example, interpose an electro-optical material, such as liquid crystal, between an element substrate on which a pixel electrode and a transistor, such as a pixel switching TFT, which is electrically connected to the pixel electrode, are provided, and an opposite substrate on which an opposite electrode opposing the pixel electrode is provided. During an operation of the electro-optical device, selectively supplying image signals to the pixel electrode enables displaying of images in a pixel area (or an image display area) in which a plurality of pixel electrodes are arrayed. In addition, for example, by causing the transistor, which is positioned between a data line and the pixel electrode and is electrically connected to the data line and the pixel electrode, to turn on/off, the image signals are supplied from the data line to the pixel electrode at predetermined timings.

In an electro-optical device according to the first aspect, the first capacitor electrode is electrically connected to the pixel electrode and the transistor that is provided between the substrate and the pixel electrode. Specifically, the first capacitor electrode is provided between the pixel electrode and the transistor, for example, a drain area of the transistor and the first capacitor electrode are electrically connected to each other via a contact hole and a relay layer, and further, the first capacitor electrode and the pixel electrode are electrically connected to each other via a different contact hole and a different relay layer. That is, the first capacitor electrode relays an electric conduction between the pixel electrode and the transistor.

At the upper layer side of the first capacitor electrode, via a capacitor insulating film, the second capacitor electrode is located so as to be opposite the first electrode. To this second capacitor electrode, a predetermined electric potential is supplied via a light-shielding film, which will be described below. Owing to this configuration, the second capacitor electrode is caused to have a constant electric potential. Accordingly, the first capacitor electrode and the second capacitor electrode, which are located so as to interpose the capacitor insulating film therebetween, are configured to function as a storage capacitor that temporarily maintains the electric potential of the pixel electrode.

Between the second capacitor electrode and the pixel electrode, the light-shielding film is provided at a position where the light-shielding film is at least partially overlapped by the transistor. The light-shielding film is formed so as to include a material having a light-shielding capability higher than that of each of the first capacitor electrode and the second capacitor electrode, and optically shields the transistor from light rays incoming from the upper layer side. Further, the light-shielding film is provided so as to be electrically connected to the second capacitor electrode. The light-shielding film is formed, for example, on an interlayer insulating film, which is formed on a layer above the second capacitor electrode, and is electrically connected to the second capacitor electrode via a contact hole, which is formed in the interlayer insulating film. To the light-shielding film, a predetermined electric potential is supplied via a capacitor line and the like, and, as described above, this predetermined electric potential is supplied to the second capacitor electrode via the light-shielding film.

Here, if the light-shielding film is not provided, light rays, which are not to be inputted, are inputted to the transistor, so that an optical leakage current is likely to occur. This optical leakage current results in a cause of malfunctions of the electro-optical device.

Thus, in the first aspect of the invention, since, by providing the light-shielding film, particularly, a capability of optically shielding the transistors is enhanced, it is possible to prevent occurrences of the optical leakage currents, and realize a device of high reliability. In addition, typically, the first capacitor electrode and the second capacitor electrode are formed so as to include a material having a light-shielding capability, and therefore, also function as a member for enhancing a capability of optically shielding the transistor; however, in such a case as well, it is possible to further enhance a light-shielding capability by providing the light-shielding film according to the first aspect of the invention.

As described above, in an electro-optical device according to the first aspect of the invention, the first capacitor electrode and the second capacitor electrode enable realization of forming a storage capacitor, and further, the light-shielding film enables realization of a high capability of optically shielding the transistor.

An electro-optical device according to a second aspect of the invention includes a pixel electrode configured to be provided at the pixel on the substrate, a transistor configured to be provided between the substrate and the pixel electrode, a first capacitor electrode configured to be provided between the pixel electrode and the transistor, and be electrically connected to the pixel electrode and the transistor, a second capacitor electrode configured to be provided between the pixel electrode and the first capacitor electrode, be located so as to be opposite the first capacitor electrode via a first capacitor insulating film, and be supplied with a predetermined electric potential, and a light-shielding film configured to be provided between the pixel electrode and the second capacitor electrode, be located so as to be at least partially overlapped by the transistor, be located so as to be opposite the second capacitor electrode via a second capacitor insulating film, and be electrically connected to the pixel electrode via a contact hole formed in an insulating film disposed between the pixel electrode and the light-shielding film.

An electro-optical device according to the second aspect is configured to, for example, interpose an electro-optical material, such as liquid crystal, between an element substrate on which a pixel electrode and a transistor, such as a pixel switching TFT, which is electrically connected to the pixel electrode, are provided, and an opposite substrate on which an opposite electrode opposing the pixel electrode is provided. During an operation of the electro-optical device, selectively supplying image signals to the pixel electrode enables displaying of images in a pixel area (or an image display area) in which a plurality of pixel electrodes are arrayed. In addition, for example, by causing the transistor, which is positioned between a data line and the pixel electrode and is electrically connected to the data line and the pixel electrode, to turn on/off, the image signals are supplied from the data line to the pixel electrode at predetermined timings.

In an electro-optical device according to the second aspect, the first capacitor electrode is electrically connected to the pixel electrode and the transistor that is provided between the substrate and the pixel electrode. Specifically, the first capacitor electrode is provided between the pixel electrode and the transistor, for example, a drain area of the transistor and the first capacitor electrode are electrically connected to each other via a contact hole and a relay layer, and further, the first capacitor electrode and the pixel electrode are electrically connected to each other via a different contact hole and a different relay layer. That is, the first capacitor electrode relays an electric conduction between the pixel electrode and the transistor.

At the upper layer side of the first capacitor electrode, via a capacitor insulating film, the second capacitor electrode is located so as to be opposite the first electrode. To this second capacitor electrode, a predetermined electric potential is supplied via a light-shielding film, which will be described below. Owing to this configuration, the second capacitor electrode is caused to have a constant electric potential. Accordingly, the first capacitor electrode and the second capacitor electrode, which are located so as to interpose the capacitor insulating film therebetween, are configured to function as a storage capacitor that temporarily maintains the electric potential of the pixel electrode.

Between the second capacitor electrode and the pixel electrode, the light-shielding film is provided at a position where the light-shielding film is at least partially overlapped by the transistor. The light-shielding film is formed so as to include a material having a light-shielding capability higher than that of each of the first capacitor electrode and the second capacitor electrode, and optically shields the transistor from light rays incoming from the upper layer side.

Here, if the light-shielding film is not provided, light rays, which are not to be inputted, are inputted to the transistor, so that an optical leakage current is likely to occur. This optical leakage current results in a cause of malfunctions of the electro-optical device.

Thus, in the second aspect of the invention, since, by providing the light-shielding film, particularly, capability of optically shielding the transistor is enhanced, it is possible to prevent occurrences of the optical leakage currents, and realize a device of high reliability. In addition, typically, the first capacitor electrode and the second capacitor electrode are formed so as to include a material having a light-shielding capability, and therefore, also function as a member for enhancing a capability of optically shielding the transistor; however, in such a case as well, it is possible to further enhance a light-shielding capability by providing the light-shielding film according to the first aspect of the invention.

The light-shielding film according to the second aspect of the invention is located so as to be opposite the second capacitor electrode via the second capacitor insulating film, and further, is electrically connected to the pixel electrode via a contact hole formed in the insulating film. The light-shielding film is caused to have an electric potential the same as that of the first capacitor electrode by being electrically connected to the pixel electrode. Accordingly, the second capacitor electrode and the light-shielding film, which are located so as to be opposite each other via the second capacitor insulating film, are configured to, just like the first capacitor electrode and the second capacitor electrode, function as a storage capacitor for temporarily maintaining the electric potential of the pixel electrode. Such a configuration enables formation of two storage capacitors, which are different from each other, inside the same plane. Accordingly, it is possible to realize a storage capacitor having a significantly high density.

As described above, in an electro-optical device according to the second aspect of the invention, a pair of the first capacitor electrode and the second capacitor electrode and another pair of the second capacitor electrode and the light-shielding film enable formation of a storage capacitor having a high density, and further, the light-shielding film enables realization of a high capability of optically shielding the transistor.

In the electro-optical device according to the first aspect, preferably, the light-shielding film is provided within an area of the second capacitor electrode when viewed in a plan view.

In this case, since the light-shielding film is formed in a scope narrower than that of the second capacitor electrode (in other words, an electric conduction layer that is located at the lower side of the light-shielding film), it is easier to manufacture the light-shielding film. Specifically, for example, when performing a patterning process on the light-shielding film by performing etching or the like, it is unnecessary to consider a case in which members located at the lower layer side are also whittled away. Accordingly, it is possible to make a manufacturing procedure of the electro-optical device be easier.

In the electro-optical device according to the first aspect, preferably, an oxidized film is formed on a surface of the second capacitor electrode.

In this case, since an oxidized film is formed on the surface of the second capacitor electrode, a pressure-withstanding capability is enhanced. Accordingly, it is possible to realize an electro-optical device having higher reliability. In addition, the oxidized film is formed by, for example, performing an oxidization process on the second capacitor electrode, subsequent to being subjected to a patterning process, to partially oxidize the surface of the second capacitor electrode.

In the electro-optical device according to the first aspect, preferably, the transistor has a lightly doped drain (LDD) structure, and the second capacitor electrode and the light-shielding film are electrically connected to each other via a contact hole that is at least partially overlapped with an LDD area positioned at the pixel electrode side.

In this case, the transistor has an LDD structure. More specifically, a semiconductor layer forming the transistor is configured to, in addition to a source area, which is electrically connected to a data line, a drain area, which is electrically connected to the pixel electrode, and a channel area, which is located so as to be opposite a gate electrode, include a data line side LDD area, which is provided between the source area and the channel area, and a pixel electrode side LDD area, which is provided between the drain area and the channel area.

In this case, particularly, the light-shielding film is provided, for example, on a interlayer insulating film, which is laminated on a layer above the second capacitor electrode, and the second capacitor electrode and the light-shielding film are electrically connected to each other via a contact hole, which is provided in the interlayer insulating film so as to be at least partially overlapped by the pixel electrode side LDD area of the transistor. Thus, as a result, a part of the light-shielding film provided along the contact hole is formed at the further lower side (i.e., at the transistor side). Owing to such a configuration, the light-shielding film can fulfill a light-shielding function at a position closer to the transistor in an area overlapped by the pixel electrode side LDD area where an optical leakage current is likely to occur among the individual portions of the transistor. Accordingly, it is possible to efficiently enhance a capability of optically shielding the transistor.

In the electro-optical device according to the first aspect, preferably, the predetermined electric potential is an opposite common electric potential, which is supplied to an opposite electrode that is located so as to be opposite the pixel electrode via an electro-optical material.

In this case, the opposite common electric potential that is supplied to a common electrode is supplied to the second capacitor electrode. Therefore, it is possible to configure the storage capacitor without separately providing an electric power source for supplying the second capacitor electrode with an electric potential. Accordingly, it is possible to prevent increasing of complexity of the configuration of the electro-optical device, and increasing of cost.

In the electro-optical device according to the first aspect, preferably, the first capacitor electrode is electrically connected to the pixel electrode via a relay layer, which is provided on a layer the same as that of a gate electrode of the transistor.

In this case, by using the relay layer, which is provided on the same layer as the gate electrode, it is possible to realize an electric conduction between the first capacitor electrode and the pixel electrode by performing a relatively simple configuration. In addition, the relay layer in this case is a layer that is electrically separated from the gate electrode, and "the same layer" means a layer that is formed during the same film forming process.

An electronic apparatus according to a third aspect of the invention includes the above-described electro-optical device according to the first aspect or the above-described electro-optical device according to the second aspect.

An electronic apparatus according to the third aspect, which includes the above-described electro-optical device according to the first aspect, or the above-described electro-optical device according to the second aspect, can realize various electronic apparatuss, each having high reliability and being capable of displaying high-quality images, such as a projection-type display, a television set, a mobile-phone, an electronic organizer, a word processor, a view-finder-type or a monitor-direct-view-type video tape recorder, a work station, a video-phone, a POS terminal, and a touch panel. Further, as electronic apparatuss according to the third aspect, it is possible to realize an electrophoretic device, such as an electronic paper, and the like.

A manufacturing method for manufacturing an electro-optical device according to the first aspect or the second aspect of the invention includes a pixel electrode forming step in which, on the substrate, a pixel electrode is formed for each pixel, a transistor forming step in which a transistor is formed so as to correspond to the pixel electrode, a first capacitor electrode forming step in which a first capacitor electrode is formed so as to be electrically connected to each of the pixel electrode and the transistor, a second capacitor forming step in which a second capacitor electrode is formed at the upper layer side of the first capacitor electrode so as to be located opposite the first capacitor electrode via a capacitor insulating film, a patterning step in which a patterning process on the first capacitor electrode and the second capacitor electrode is performed by using the same mask, an oxidization process step in which, subsequent to the patterning step, an oxidization process on the first capacitor electrode and the second capacitor electrode is performed, and a light-shielding forming step in which, subsequent to the oxidization process step, a light-shielding film is formed at a position on a layer above the second capacitor electrode, in which the light-shielding film is at least partially overlapped by the transistor.

In a method for manufacturing an electro-optical device according to the first aspect or the second aspect of the invention, on the substrate, pixel electrodes and transistors are formed so that each of the transistors corresponds to one of the pixel electrodes. In addition, typically, the pixel electrodes are formed on the highest layer of the laminated structure subsequent to completion of lamination of individual members, which will be hereinafter described. That is, orders of respective manufacturing steps of manufacturing an electro-optical device according to the first aspect or the second aspect of the invention may be interchanged, if the orders are not particularly specified.

The first capacitor electrode is formed so as to be connected to each of the pixel electrode and the transistor. At the upper layer side of the first capacitor electrode, the second capacitor electrode is formed so as to be located opposite the first capacitor electrode via the capacitor insulating film. The first capacitor electrode and the second capacitor electrode, which are located opposite each other via the capacitor insulating film, are configured to function as the storage capacitor for temporarily maintain the electric potential of the pixel electrode.

Here, in the manufacturing method for manufacturing an electro-optical device according to the first aspect of the second aspect of the invention, particularly, the first capacitor electrode and the second capacitor electrode are each subjected to a patterning process by using the same mask. That is, the first capacitor electrode and the second capacitor electrode are subjected to a patterning process in block. The first capacitor electrode and the second capacitor electrode having been subjected to the patterning process are subjected to an oxidization process. Owing to this oxidization process, it is possible to enhance a pressure-withstanding capability of each of the first capacitor electrode and the second capacitor electrode.

Subsequently, on a layer above the second capacitor electrode, the light-shielding film is formed at a position where the second capacitor electrode is at least partially overlapped by the transistor. That is, the light-shielding film is formed subsequent to the oxidization process performed on the first capacitor electrode and the second capacitor electrode forming the storage capacitor. The light-shielding process is formed so as to include a material having a light-shielding capability higher than that of each of the first capacitor electrode and the second capacitor electrode, and optically shields the transistor from light rays incoming from the upper layer side.

Here, if an oxidation process on a high melting point metal having a high light-shielding capability is performed, contamination of an oxidation processing device and cracks due to stress frequently occur, and such a situation is not preferable from a practical perspective. In contrast, in this manufacturing method, as described above, the light-shielding film is formed subsequent to completion of the oxidation process performed on the members forming the storage capacitor. That is, the oxidation process is not performed on the light-shielding film. Accordingly, it is possible to prevent occurrences of such disadvantages from a practical perspective as described above.

As described above, in the manufacturing method for manufacturing an electro-optical device according to the first aspect or the second aspect of the invention, it is possible to significantly appropriately manufacture an electro-optical device, having a storage capacity, and further, being capable of realizing a high capability of optically shielding the transistor.

In such a manufacturing method for manufacturing an electro-optical device according to the first aspect or the second aspect of the invention, preferably, an interlayer insulating film forming step, in which, on a layer above the second capacitor electrode, an interlayer insulating film having a thickness thinner than that of each of the second capacitor electrode and the light-shielding film is formed, and a contact hole forming step, in which a contact hole is formed in the interlayer insulating film, are further included, and in the light-shielding film forming step, the light-shielding film is formed so as to be electrically connected to the second capacitor electrode via the contact hole.

In this case, since the light-shielding film and the second capacitor electrode are electrically connected to each other via the contact hole, it is possible to supply an electric potential for maintaining the electric potential of the second capacitor electrode to be constant via the light-shielding film located at the upper layer side. Further, since the interlayer insulating film, which is formed between the light-shielding film and the second capacitor electrode, has a thickness thinner than that of each of the light-shielding film and the second capacitor electrode, it is possible to form the light-shielding film at the further lower side (in other words, at the transistor side). Accordingly, it is possible to enhance a capability of optically shielding the transistor.

Operations and other advantages of the invention will be obvious from embodiments of the invention, which will be hereinafter described.

BRIEF DESCRIPTION OF THE DRAWINGS

The invention will be described with reference to the accompanying drawings, wherein like numbers reference like elements.

FIG. 17 is a plan view illustrating a configuration of an example of an electronic apparatus to which an electro-optical device according to a first embodiment or a second embodiment of the invention.

DESCRIPTION OF EXEMPLARY EMBODIMENTS

Hereinafter, embodiments according to the invention will be described with reference to drawings.
Electro-Optical Device Electro-optical devices according to respective embodiments will be hereinafter described with reference to FIGS. 1 to 10. In addition, each of the following embodiments will be described by providing a liquid crystal device, which incorporates a driving circuit therein and employs a TFT active matrix driving method, as an example of an electro-optical device according to each of aspects of the invention.

First Embodiment

Firstly, a whole configuration of an electro-optical device according to a first embodiment will be described with reference to FIGS. 1 and 2. Here, FIG. 1 is a plan view illustrating a whole configuration of an electro-optical device according to this embodiment, and FIG. 2 is a cross-sectional view taken along the line II-II of FIG. 1.

Figure 1:
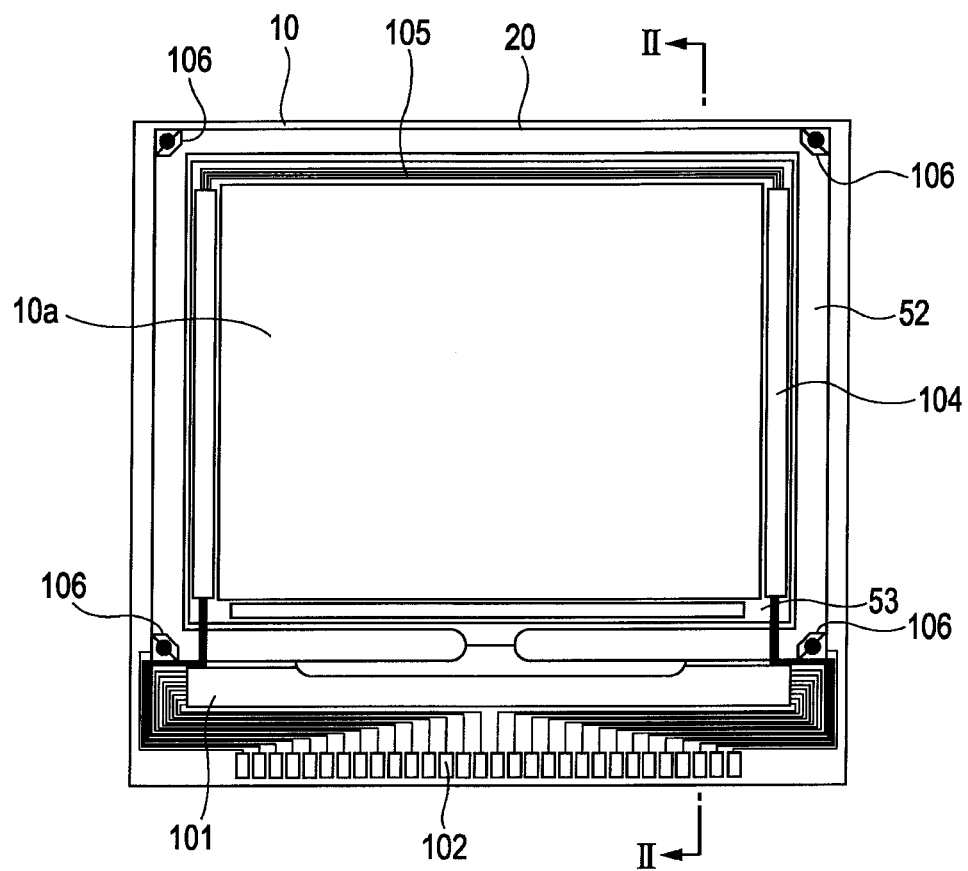
FIG. 1 is a plan view illustrating a whole configuration of an electro-optical device according to a first embodiment of the invention.
Figure 2:
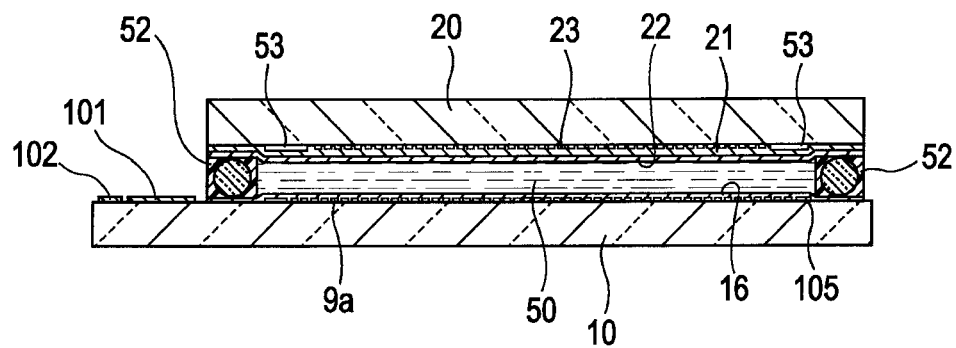
FIG. 2 is a cross-sectional view taken along the II-II line of FIG. 1.

In FIGS. 1 and 2, an electro-optical device according to this embodiment has a TFT array substrate 10 and an opposite substrate 20 which are located so as to be opposite each other. The TFT array substrate 10 is a transparent substrate, such as a quartz substrate or a glass substrate, a silicon substrate or the like. The opposite substrate 20 is a transparent substrate, such as a quartz substrate or a glass substrate. Between the TFT array substrate 10 and the opposite substrate 20, a liquid crystal layer 50 is encapsulated. The liquid crystal layer 50 is formed of, for example, liquid crystal resulting from mixing a single kind or several kinds of nematic liquid crystal, and takes a predetermined alignment condition between a pair of alignment films.

The TFT array substrate 10 and the opposite substrate 20 are bonded to each other by using a sealing material 52 that is provided in a sealing area, which is located surrounding an image display area 10a in which a plurality of pixel electrodes are formed.

The sealing material 52 is made of, for example, an ultra-violet-curing resign, a thermo-setting resin or the like, which is used for causing the both substrates to be bonded to each other. Further, in a manufacturing process, the sealing material 52 is coated on the TFT array substrate 10, and subsequently thereto, is harden by means of exposure to ultraviolet radiation, heat soaking or the like. The sealing material 52 has gap materials dispersed therein, such as glass fibers or glass beads, which are used for maintaining the size of a space between the TFT array substrate 10 and the opposite substrate 20 (i.e., a gap between the substrates) to be a predetermined constant value. In addition, gap materials may be configured to, in addition to or in substitution for the gap materials that are mixed in the sealing material 52, be allocated in the image display area 10a or in surrounding areas that are located surrounding the image display area 10a.

Inside the sealing area in which the sealing material 52 is located, in parallel with the sealing area, a frame-shaped light-shielding film 53 having a light-shielding capability, which determines a frame-shaped area of the image display area 10a, is provided at the opposite substrate 20 side. In addition, a part or the whole of the above-described frame-shaped light-shielding film 53 may be provided at the TFT array substrate 10 side as a built-in light-shielding film.

Among the surrounding areas, in the surrounding area that is located at the outside of the sealing area in which the sealing material 52 is allocated, a data line driving circuit 101 and external circuit connection terminals 102 are provided along a side of the TFT array substrate 10. Scanning line driving circuits 104 are provided along respective two sides adjacent to this side of the TFT array substrate 10, and further, so as to be covered by the frame-shaped light-shielding film 53. Furthermore, in order to cause the two scanning line driving circuits 104 to be connected to each other, which are provided at the both sides of the TFT array substrate 10 in such a manner as described above, a plurality of wirings 105 are provided along the remaining side of the TFT array substrate 10, and further, so as to be covered by the frame-shape light-shielding film 53.

At areas being located on the TFT array substrate 10 and opposing four corner portions of the opposite substrate 20, up-and-low conductive terminals 106 for causing the both substrates to be connected to each other by using an up-and-down conductive material are provided. Owing to these members, it is possible to realize an electric conduction between the TFT array substrate 10 and the opposite substrate 20.

In FIG. 2, on the TFT array substrate 10, a laminated structure, into which pixel switching TFTs each being a driving element, and wirings, such as scanning lines and data lines, are incorporated, is formed. In FIG. 2, a detailed structure of this laminated structure is omitted from illustration, but, on this laminated structure, pixel electrodes 9a, each being made of a transparent material, such as an indium tin oxide (ITO) material, are formed so as to, for each pixel, be in an island shape and have a predetermined pattern.

The pixel electrodes 9a are formed in the image display area 10a on the TFT array substrate 10 so as to be opposite corresponding opposite electrodes 21. On the surface at the liquid crystal layer 50 side of the TFT array substrate 10, that is, on the pixel electrodes 9a, an alignment film 16 is formed so as to cover the pixel electrodes 9a.

On the surface at the TFT array substrate 10 side of the opposite substrate 20, a light-shielding film 23 is formed. The light-shielding film 23 is provided on the surface at the TFT array substrate 10 side of the opposite substrate 20 so as to form, for example, a lattice shape when viewed from a plan view. For the opposite substrate 20, a non-aperture area is determined by the light-shielding film 23, and individual areas segmented by the light-shielding film 23 become aperture areas for transmitting light rays radiating from, for example, a lamp for a projector or a backlight for a direct view. In addition, by forming the light-shielding film 23 in a stripe shape, the non-aperture area may be determined by the light-shielding film 23 and individual constituent elements, such as data lines, which are provided at the TFT array substrate 10 side.

On the light-shielding film 23, the opposite electrodes 21, each being made of a transparent material, such as an ITO material, are formed so as to be opposite the corresponding plurality of the pixel electrodes 9a. Further, on the light-shielding film 23, in order to display color images on the image display area 10a, in the aperture area and an area including a part of the non-aperture area, a color filter, which is omitted from illustration in FIG. 2, may be formed. On the opposite electrodes 21, which are formed on the surface at the TFT array substrate 10 side of the opposite substrate 20, an alignment film 22 is formed.

In addition, on the TFT array substrate 10 shown in FIGS. 1 and 2, in addition to the above-described driving circuits, such as the data line driving circuit 101 and the scanning line driving circuit 104, a sampling circuit for sampling image signals on respective image signal lines to supply the sampled image signals to respective data lines, a pre-charge circuit for supplying pre-charge signals each having a predetermined voltage level to the respective plurality of data lines prior to supplying the image signals thereto, a test circuit for testing quality, defects and the like of the electro-optical device during a manufacturing procedure thereof and/or at the shipment thereof.

Next, an electric configuration of a pixel portion of an electro-optical device according to this embodiment will be hereinafter described with reference to FIG. 3. Here, FIG. 3 is an equivalent circuit diagram illustrating individual elements, wirings and the like associated with a plurality of pixels being formed in a matrix shape and constituting an image display area included in an electro-optical device according to this embodiment.

Figure 3:
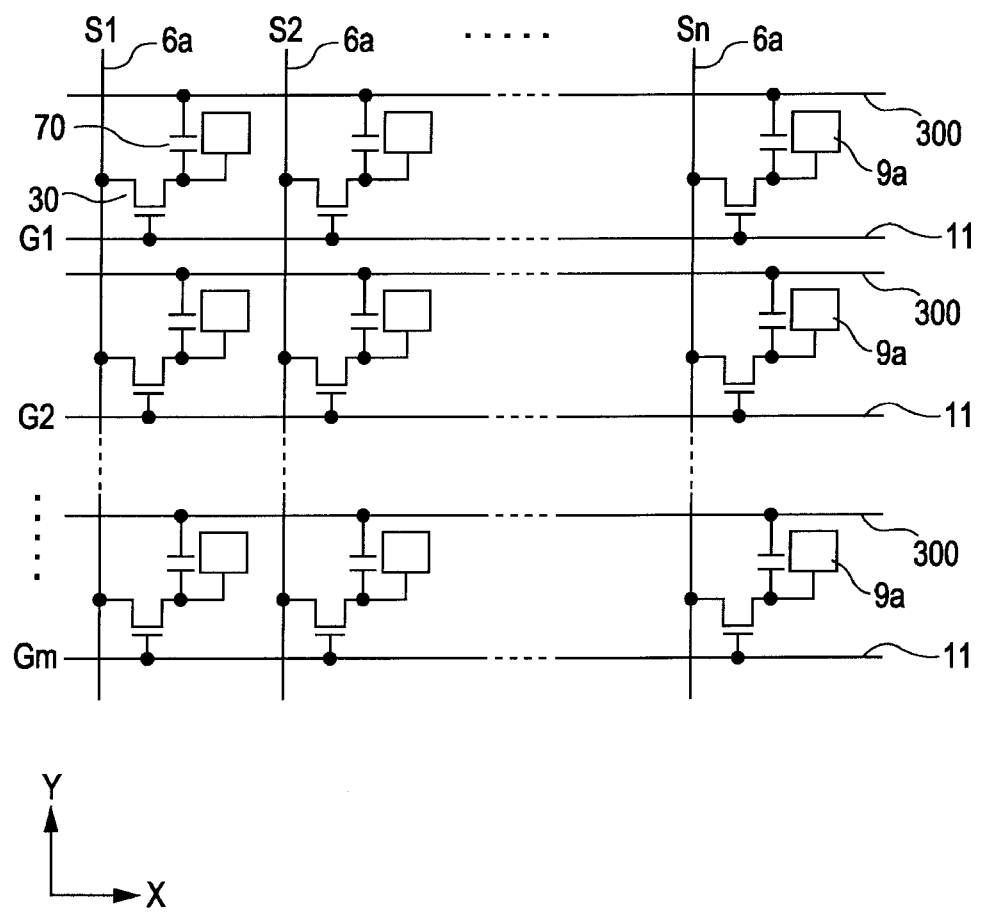
FIG. 3 is an equivalent circuit diagram illustrating individual elements, wirings and the like with respect to a plurality of pixels included in an electro-optical device according to a first embodiment of the invention.

In FIG. 3, in each of the plurality of pixels being formed in a matrix shape and constituting the image display area 10a, the pixel electrode 9a and a TFT 30 are formed. The TFT 30 is electrically connected to the pixel electrode 9a, and performs switching control of the pixel electrode 9a during an operation of an electro-optical device according to this embodiment. Each of data lines 6a, to which an image signal is supplied, is electrically connected to a source of the TFT 30. Image signals S1, S2, . . . , Sn, which are written into the respective data lines 6a, may be line-sequentially supplied in such an order as described above, or may be supplied in block to each group consisting of a plurality of the data lines 6a, any successive two of which are located adjacent each other.

To gates of the respective TFTs 30, corresponding scanning lines 11 are electrically connected, and an electro-optical device according to this embodiment is configured to line-sequentially supply pulse-formed scanning signals G1, G2, . . . , Gm to the corresponding scanning lines 11 at predetermined timings in such an order as described above. The pixel electrodes 9a are electrically connected to drains of the respective TFTs 30, and by causing switching elements, i.e., the TFTs 30 to close switches thereof during a constant period of time, the image signals S1, S2, . . . , Sn, which are supplied from the respective data lines 6a, are written into the corresponding pixel electrodes 9a at predetermined timings. Each of the image signals S1, S2, . . . , Sn, having a predetermined voltage level and having been written into liquid crystal via the corresponding pixel electrode 9a, the liquid crystal being an example of an electro-optical material, is maintained for a constant period of time between the pixel electrode 9a and the corresponding opposite electrode formed on the opposite substrate.

The liquid crystal constituting the liquid crystal layer 50 (refer to FIG. 2) includes molecular aggregates therein, respective alignments and orders of which vary in accordance with corresponding levels of voltages applied thereto, and the variations of alignments and orders of respective molecular aggregates modulate light rays and enable displaying in gray scale. For example, in a normally white mode, for each pixel, a transparent ratio relative to a level of an incoming light ray decreases in accordance with increase of a level of a voltage applied to the pixel; whilst, in a normally black mode, for each pixel, a transparent ratio relative to a level of an incoming light ray increases in accordance with increase of a level of a voltage applied to the pixel, and as a whole, light rays having contrasts in accordance with image signals are outputted from an electro-optical device according to this embodiment.

Here, in order to prevent a leakage of an image signal having been maintained, a storage capacitor 70 is added in parallel with a liquid crystal capacitance which is formed between the pixel electrode 9a and the opposite electrode 21 (refer to FIG. 2). The storage capacitor 70 is a capacitor element functioning as a storage capacitor for temporarily maintaining an electric potential of each of the pixel electrodes 9a in accordance with supply of an image signal. A specific configuration of the storage capacitor 70 will be hereinafter described in detail.

Figure 4:
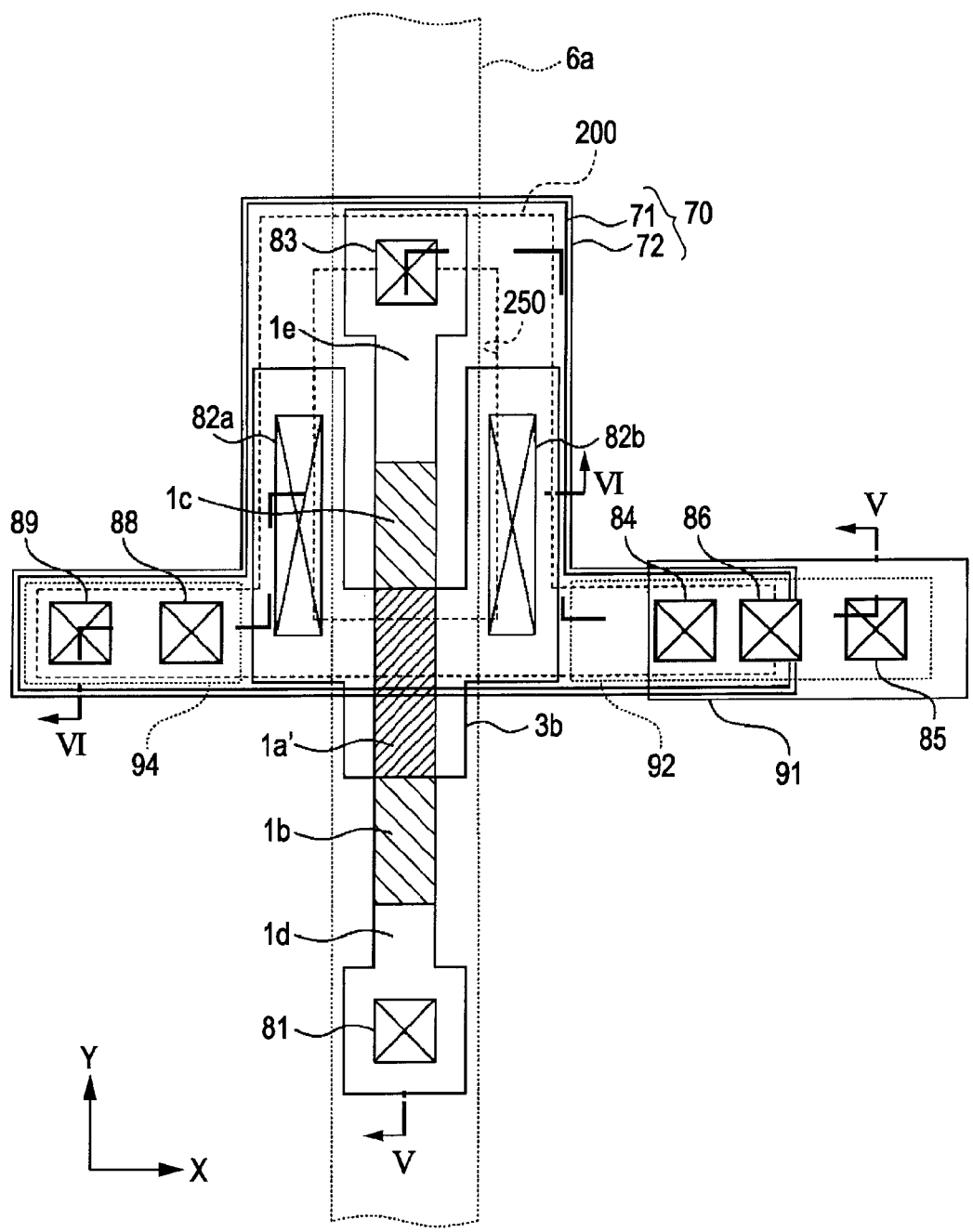
FIG. 4 is a plan view transparently illustrating locations of conductive layers around a TFT in an electro-optical device according to a first embodiment of the invention.
Figure 5:
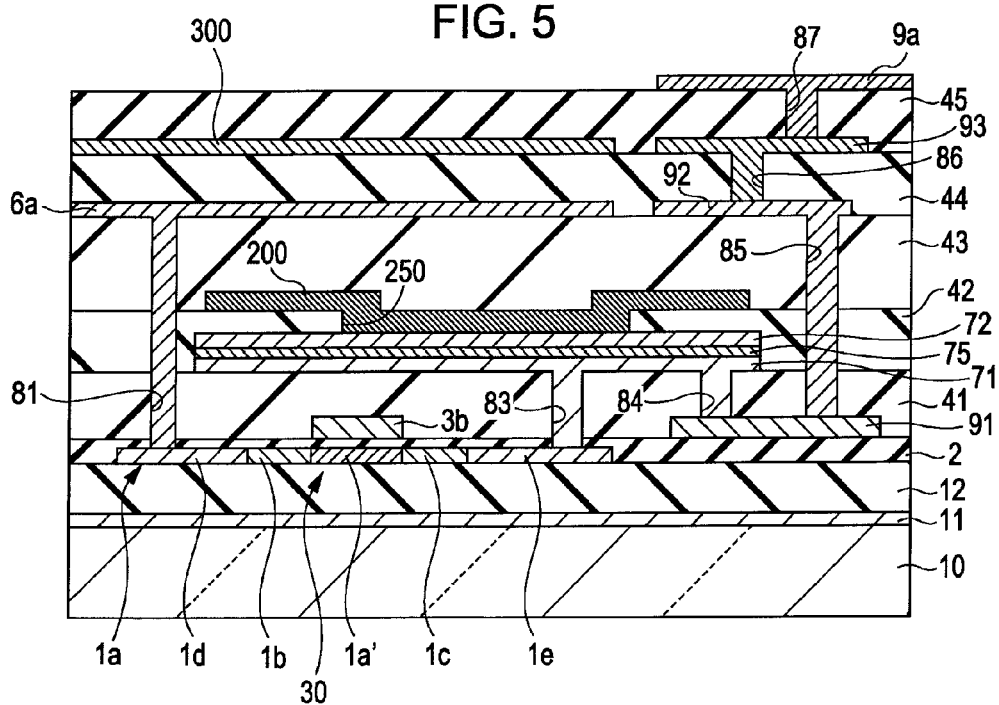
FIG. 5 is a cross-sectional view taken along the V-V line of FIG. 4.
Figure 6:
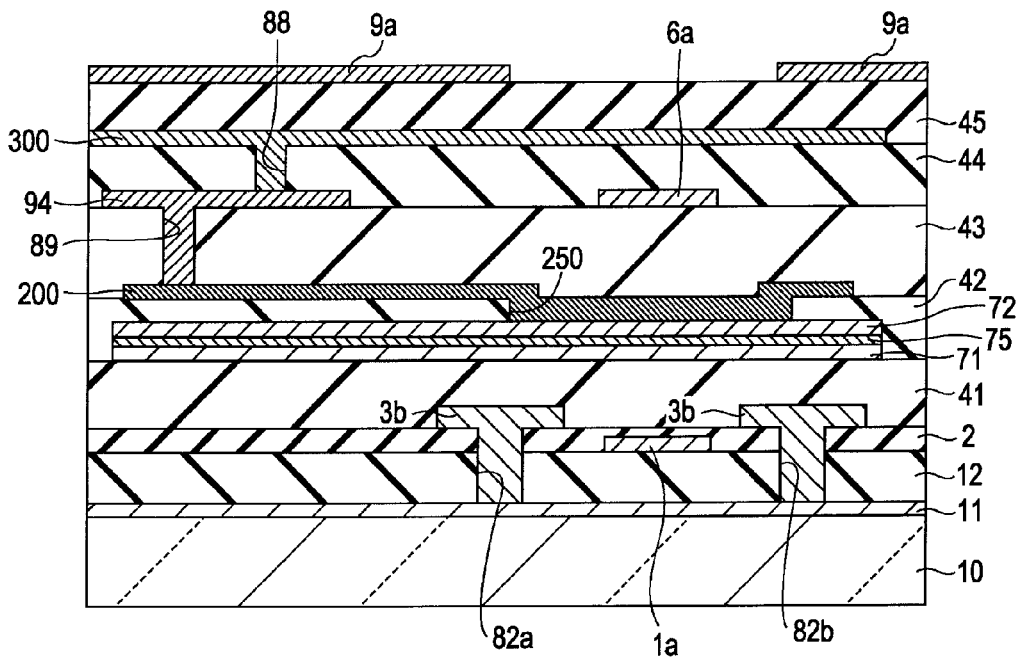
FIG. 6 is a cross-sectional view taken along the VI-VI line of FIG. 4.

Next, a specific configuration of a pixel portion in which the above-described operation is realized will be hereinafter described with reference to FIGS. 4 to 6. Here, FIG. 4 is a plan view transparently illustrating locations of respective conductive layers around a TFT included in an electro-optical device according to a first embodiment. Further, FIG. 5 is a cross-sectional view taken along the V-V line of FIG. 4, and FIG. 6 is a cross-sectional view taken along the VI-VI line of FIG. 4. In addition, in FIGS. 4 to 6, in order to make the size of each of layers and members be in a recognizable degree in individual drawings, for respective layers and members, scale ratios are caused to be different from one another. Further, in FIG. 4, for the sake of convenience of explanation, individual layers that are located at the lower layer side of the semiconductor layer and at the upper layer side of the data lines are omitted from illustrations.

In FIGS. 4 and 5, the TFT 30 is configured to include a semiconductor layer 1a and a gate electrode 3b.

The semiconductor layer 1a is formed of, for example, polysilicon, and includes a channel area 1a' having a channel length along a Y axis, a data line side LDD area 1b and a pixel electrode side LDD area 1c, and a data line side source drain area 1d and a pixel electrode side source drain area 1e. That is, the TFT 30 has the LDD structure.

The data line side source drain area 1d and the pixel electrode side source drain area 1e are formed so as to be approximately mirror-symmetrical to each other along the Y axis on the basis of the channel area 1a'. The data line side LDD area 1b is formed between the channel area 1a' and the data line side source drain area 1d. The pixel electrode side LDD area 1c is formed between the channel area 1a' and the pixel electrode side source drain area 1e. The data line side LDD area 1b, the pixel electrode side LDD area 1c, the data line side source drain area 1d and the pixel electrode side source drain area 1e are impurity areas resulting from performing doping of impurities into the semiconductor layer 1a by using an impurity doping method, such as an ion implantation method. The data line side LDD area 1b and the pixel electrode side LDD area 1c are each formed as a low concentration impurity area having an amount of impurities smaller than that of each of the data line side source drain area 1d and the pixel electrode side source drain area 1e. Owing to such impurity areas, it is possible to reduce an amount of an off-current flowing between the source area and the drain area during a non-operation of the TFT 30, and further, suppress reduction of an on-current flowing during an operation of the TFT 30. In addition, preferably, the TFT 30 has the LDD structure, but may have an offset structure in which doping of impurities into the data line side LDD area 1b and the pixel electrode LDD area 1c is not performed, or may be a self-alignment type in which the data line side source drain area 1d and the pixel electrode side source drain area 1e are formed by performing doping of high-concentration impurities using the gate electrode as a mask.

The gate electrode 3b is formed of, for example, a conductive polysilicon material, and is formed so as to be partially opposite the channel area 1a' of the semiconductor layer 1a. The gate electrode 3b and the semiconductor layer 1a are electrically insulated each other by a gate insulating film 2 interposed therebetween. Further, on the same layer as the gate electrode 3b, a first relay layer 91 is formed.

In FIGS. 5 and 6, the scanning lines 11 are provided on a layer above the array substrate 10, the layer being located at the lower layer side of the TFT 30 via a ground insulating film 12 formed on the TFT 30. The scanning lines 11 are each formed of a material having a light-shielding capability, such as an unalloyed metal, an alloyed metal, a silicide material, a polysilicide material or a material resulting form laminating these materials, which includes at least one of high melting point metals, such as titan (Ti), chromium (Cr), tungsten (W), tantalum (Ta), molybdenum (Mo) and palladium (Pd). The scanning lines 11 also function as a lower side light-shielding film, which optically shields the channel area 1a' and surrounding areas thereof from returned light rays incoming into the device from the TFT array substrate 10 side, such as light rays reflecting from the rear surface of the TFT array substrate 10, and light rays originating from a different liquid crystal device and passing through a light synthesizing optical system in a multi-plate type projector or the like.

In FIG. 6, the scanning lines 11 are connected to the respective gate electrodes 3b via contact holes 82a and 82b. Owing to these connections, gate signals transmitted via the scanning lines 11 are supplied to the respective gate electrodes 3b.

A ground insulating film 12 has a function of insulating the TFT 30 from the scanning lines 11 at an intermediate layer therebetween, as well as a function of preventing degradation of the characteristics of the pixel switching TFT 30 due to roughness resulting from polishing the surface of the TFT array substrate 10, residual contamination after abstersion and the like, by being formed on the whole surface of the TFT array substrate 10.

In FIGS. 5 and 6, on a layer above the TFT array substrate 10, the layer being located at the upper layer side of the TFT 30 via a first interlayer insulating film 41 formed on the TFT 30, the storage capacitor 70 is provided. The storage capacitor 70 is formed by allocating a lower-portion capacitor electrode 71 and an upper-portion capacitor electrode 72 so that they can be located opposite each other via a dielectric film 75. In addition, here, the lower-portion capacitor electrode 71 is an example of "a first capacitor electrode" according to some aspects of the invention, the upper-portion capacitor electrode 72 is an example of "a second capacitor electrode" according to some aspects of the invention, and the dielectric film 75 is an example of "a capacitor insulating film" according to some aspects of the invention.

The upper-portion capacitor electrode 72 is a constant electric-potential side capacitor electrode, which is electrically connected to a constant electric-potential source via a capacitor line 300 described below and is maintained to be a constant electric potential. The upper-portion capacitor electrode 72 is formed of a non-transparent metallic film including a non-alloyed metal, such as aluminum (Al) or silver (Ag), or an alloyed metal made of metals, such as aluminum (Al) and silver (Ag), and also functions as an upper-side light-shielding film (a built-in light-shielding film) for optically shielding the TFT 30. In addition, the upper-portion capacitor electrode 72 may be formed of a non-alloyed metal, an alloyed metal, a metal silicide material, a polysilicide material, a material resulting from laminating these materials or the like, which includes at least one of high melting point metals, such as Ti, Cr, W, Ta, Mo and Pd. In this case, it is possible to enhance the function of the upper-portion capacitor electrode 72 as the built-in light-shielding film.

The lower-portion capacitor electrode 71 is a pixel electric-potential side capacitor electrode which is electrically connected to the pixel electrode side source drain area 1e and the pixel electrode 9a of the TFT 30. Further specifically, the lower-portion capacitor electrode 71 is electrically connected to the pixel electrode side source drain area 1e via a contact hole 83, and further, is electrically connected to the first relay layer 91 via a contact hole 84. The first relay layer 91 is electrically connected to a second relay layer 92 via a contact hole 85. The second relay layer 92 is connected to a third relay layer 93 via a contact hole 86. The third relay layer 93 is connected to the pixel electrode 9a via a contact hole 87. That is, the lower-portion capacitor electrode 71 relays an electric connection between the pixel electrode side source drain area 1e and the pixel electrode 9a together with the first relay layer 91, the second relay layer 92 and the third relay layer 93. In addition, the lower-portion capacitor electrode 71 also has a function of a light-absorbing layer or a light-shielding film which is disposed between the upper-portion capacitor electrode 72 functioning as an upper side light-shielding film and the TFT 30, besides a function as the pixel electric-potential side capacitor electrode.

The dielectric film 75 has a mono-layer structure configured to include an oxide silicon (S102) film, such as a high temperature oxide (HTO) film or a low temperature oxide (LTO) film, a silicon nitride (SiN) film or the like, or has a multi-layer structure configured to include oxide silicon (SiO2) films, such as high temperature oxide (HTO) films or low temperature oxide (LTO) films, silicon nitride (SiN) films or the like.

The upper-portion capacitor electrode 72, the lower-portion capacitor electrode 71 and the dielectric film 75, having been described above, are formed in the same area by, for example, being subjected to a patterning process using the same mask. Owing to the storage capacitor 70 having been formed in such a manner as described above, it is possible to realize enhancement of characteristics of maintaining an electric potential with respect to the pixel electrode 9a, and enhancement of display characteristics, such as an increase of contrast and a reduction of occurrences of flickering.

In FIGS. 5 and 6, on a layer above the TFT array substrate 10, the layer being located at the upper layer side of the storage capacitor 70 via a second interlayer insulating film 42 formed on the storage capacitor 70, a light-shielding film 200 is provided. The light-shielding film 200 is configured to include, for example, a tungsten silicide material and the like, and has a relatively high light-shielding capability among individual conductive layers provided in the non-aperture area.

Further, the light-shielding film 200 is electrically connected to the upper-portion capacitor electrode 72 via a contact hole 250, which is formed in the second interlayer insulating film 42, so that the light-shielding film 200 can supply an electric potential supplied via the capacitor line 300 to the upper-portion capacitor electrode 72. Specifically, as shown in FIG. 6, the capacitor line 300 is electrically connected to a fourth relay layer 94 via a contact hole 88. Further, the fourth relay layer 94 is electrically connected to the light-shielding film 200 via a contact hole 89. From the capacitor line 300, as a constant electric potential, for example, an opposite common electric potential (i.e., an electric potential supplied to the opposite electrode 20 (refer to FIG. 2)) is supplied.

In FIG. 4, the contact hole 250, which causes the light-shielding film 200 and the upper-portion capacitor electrode 72, which have been described above, to be electrically connected to each other, is formed so as to be overlapped by the pixel electrode side LDD area 1c of the TFT 30. Owing to this configuration, as a result, the light-shielding film 200 is allocated at a further lower side (i.e., at a side closer to the TFT) in an area overlapped by the pixel electrode side LDD area 1c. Therefore, it is possible to enhance a capability of optically shielding the TFT. Here, particularly, since, among the individual areas of the TFT 30, the pixel electrode side LDD area 1c is an area where an optical leakage current is relatively likely to occur, owing to the configuration described above, it is possible to realize a significantly efficient light shielding.

In FIGS. 5 and 6, on a layer above the TFT array substrate 10, the layer being located at the upper layer side of the light-shielding film 200 via a third interlayer insulating film 43 formed on the light-shielding film 200, the data lines 6a, the second relay layer 92 and the fourth relay layer 94 are provided.

The data lines 6a are electrically connected to the data line side source drain area 1d of the semiconductor layer 1a via a contact hole 81 passing through the first interlayer insulating film 41, the second interlayer insulating film 42, and the third interlayer insulating film 43. The data lines 6a and the inside of the contact hole 81 are each formed of, for example, a material including aluminum (Al), such as Al—Si—Cu or Al—Cu, non-alloyed aluminum, or a multi-layer film consisting of an Al layer, a TIN layer and the like. The data lines 6a also have the function of optically shielding the TFT 30.

The second relay layer 92 and the fourth relay layer 94 are formed on the same layer as the data lines 6a on the third interlayer insulating film 43. The data lines 6a, the second relay layer 92 and the fourth relay layer 94 are formed in a mutually separated condition by partially removing a thin film, that is, by performing a patterning process on a thin film, which is made of a conductive material, such as a metallic film, and is formed in advance on the third interlayer insulating film 43 by using a thin-film forming method. By forming the data lines 6a, the second relay layer 92 and the fourth relay layer 94 during the same process in such a manner as described above, it is possible to make manufacturing processes of the device be simpler and easier.

In FIGS. 5 and 6, on a layer above the TFT array substrate 10, the layer being located at the upper layer side of the data lines 6a via a fourth interlayer insulating film 44 formed on the data lines 6a, the capacitor lines 300 and the third relay layer 93 are provided.

The capacitor lines 300 are configured to include a metallic material, such as aluminum, and, as described above, supplies a constant electric potential to the upper-portion capacitor electrode. Meanwhile, the third relay layer 93, which is formed on the same layer as the capacitor lines 300, relays an electric conduction between the pixel electrode side source drain area 1e of the semiconductor layer 1a, and the pixel electrode 9a.

In FIGS. 5 and 6, the pixel electrodes 9a are formed on a layer at the upper layer side of the capacitor lines 300 via a fifth interlayer insulating film 45 formed on the capacitor lines 300. The pixel electrodes 9a are electrically connected to the pixel electrode side source drain area 1e of the semiconductor layer 1a via the third relay layer 93, the second relay layer 92, the first relay layer 91 and the lower-portion capacitor electrode 71. The contact hole 87, which causes the pixel electrode 9a and the third relay layer 93 to be electrically connected to each other, is formed by forming a film that is made of a conductive material, such as an ITO material, which forms the pixel electrode 9a, on the surface of the inner wall of a hole portion that is formed so as to pass through the fifth interlayer insulating layer 45. On the upper side surface of the pixel electrode 9a, an alignment film having been subjected to a predetermined alignment process, such as a rubbing process, is provided.

The above-described configuration of the pixel portion is common to the individual pixel portions, and such a pixel portion is cyclically formed in the image display area 10a (refer to FIG. 1).

As described above, in an electro-optical device according to the first embodiment, the storage capacitor 70 is included, and further, the light-shielding film 200 makes it possible to obtain a high capability of optically shielding the TFT 30. Accordingly, it is possible to realize an electro-optical device having high reliability and being capable of displaying high-quality images.

Second Embodiment

Figure 7:
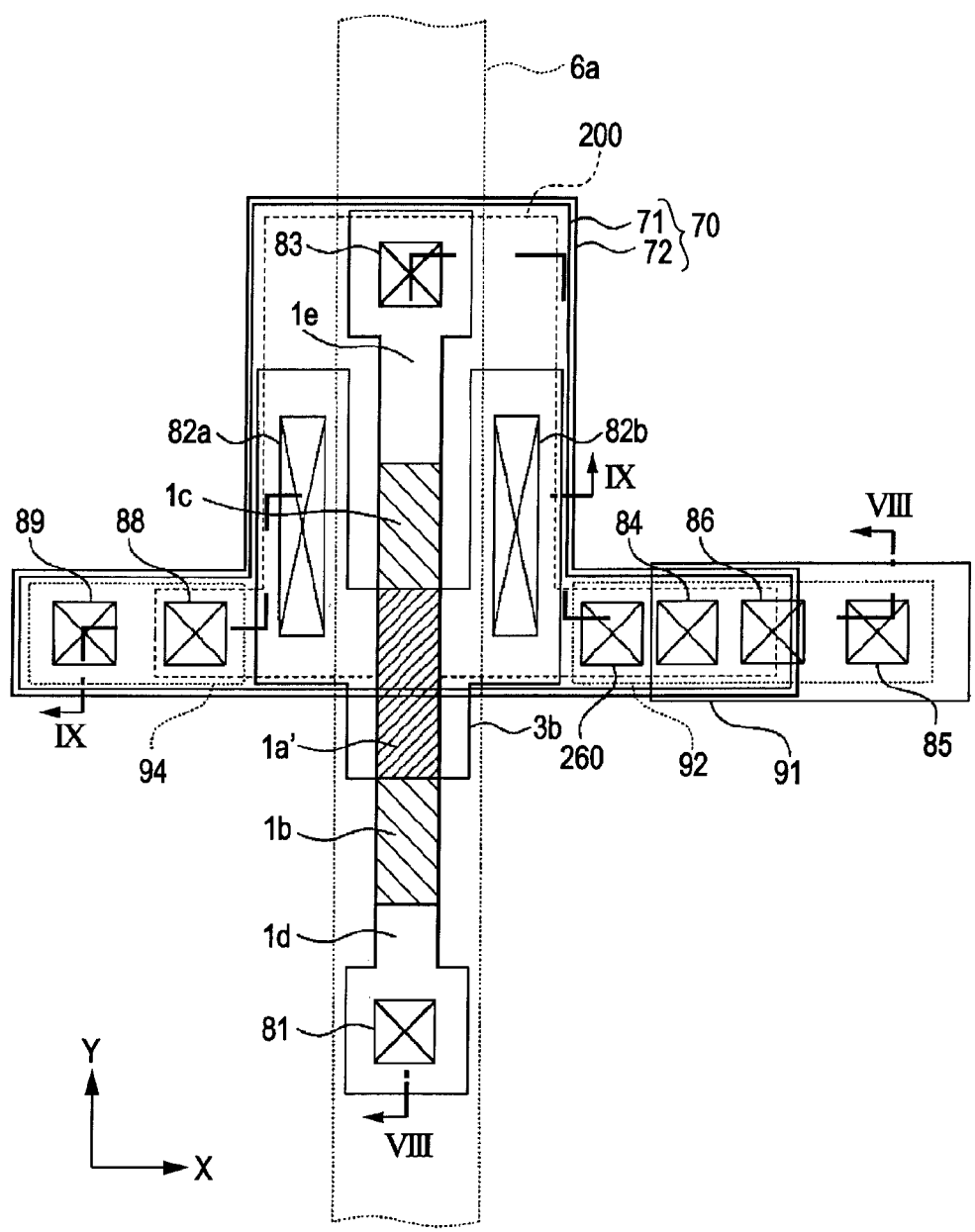
FIG. 7 is a plan view transparently illustrating locations of electric conduction layers around a TFT in an electro-optical device according to a second embodiment of the invention.
Figure 8:
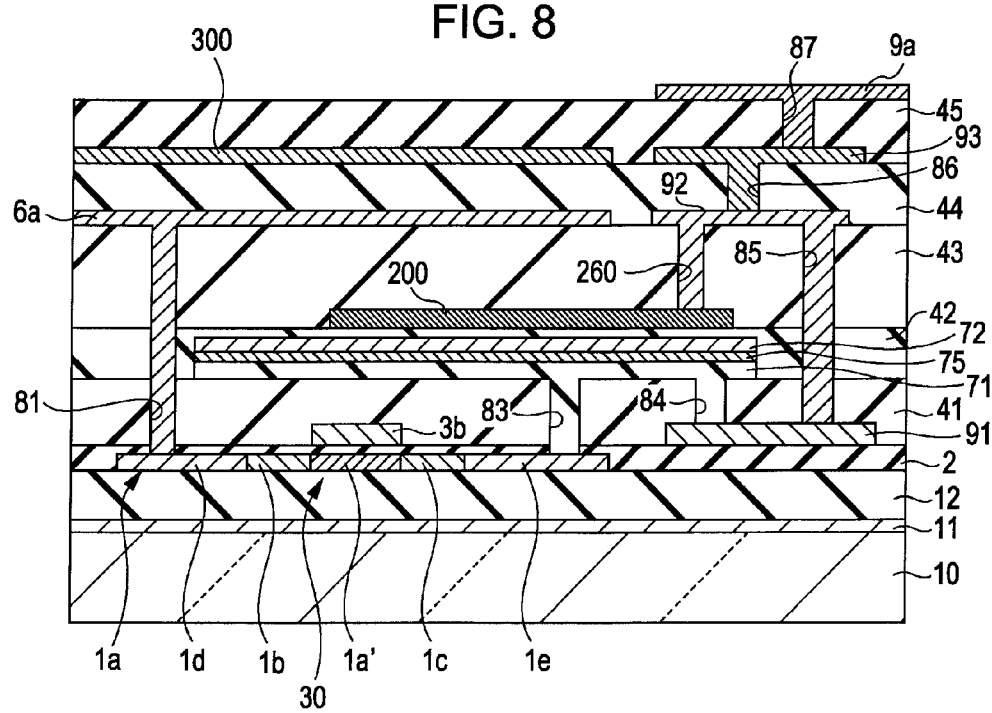
FIG. 8 is a cross-sectional view taken along the VIII-VIII line of FIG. 7.
Figure 9:
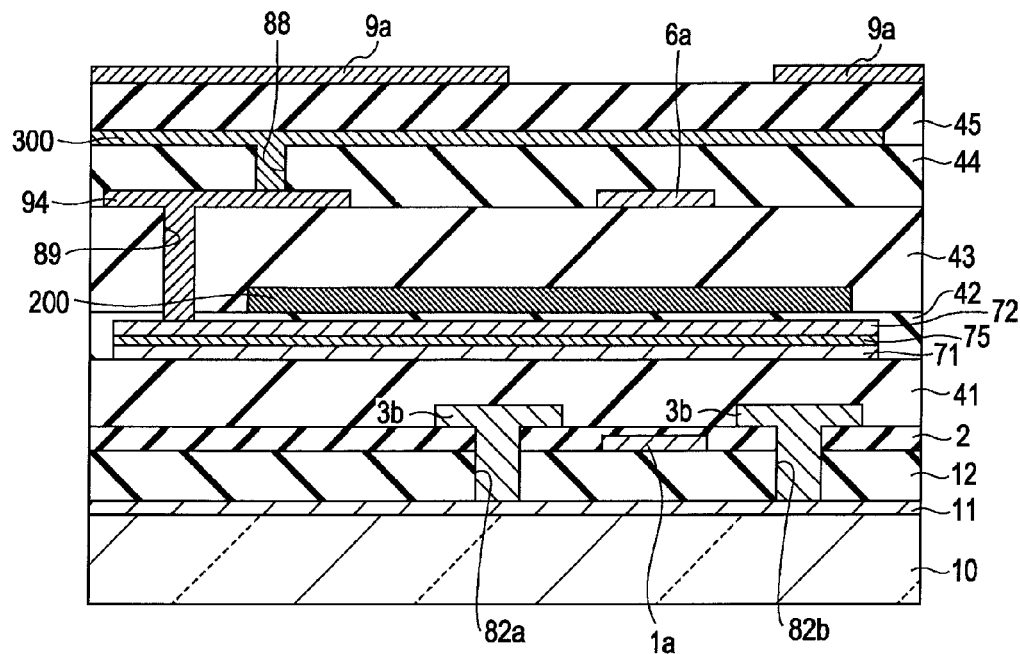
FIG. 9 is a cross-sectional view taken along the IX-IX line of FIG. 7.

Next, an electro-optical device according to a second embodiment will be hereinafter described with reference to FIGS. 7 to 10. Here, FIG. 7 is a plan view transparently illustrating locations of respective conductive layers around a TFT included in an electro-optical device according to the second embodiment. FIG. 8 is a cross-sectional view taken along the VIII-VIII line of FIG. 7, and FIG. 9 is a cross-sectional view taken along the IX-IX line of FIG. 7. Further, FIG. 9 is a cross-sectional view illustrating a modified example of an electro-optical device according to the second embodiment. In addition, in FIGS. 7 to 10, in order to make the size of each of layers and members be in a recognizable degree in individual drawings, for respective layers and members, scale ratios are caused to be different from one another. Further, for the sake of convenience of explanation, individual layers that are located at the lower layer side of the semiconductor layer and at the upper layer side of the data lines are omitted from illustration.

Compared with the above-described first embodiment, a second embodiment described below is different from the first embodiment in a part of the laminated structure, but, for the other part, the second embodiment is approximately the same as the first embodiment. Therefore, in this second embodiment, differences with the first embodiment will be described in detail, and the other overlapping portions will be appropriately omitted from description.

In FIGS. 7 to 9, in an electro-optical device according to this second embodiment, the contact hole 250, which is formed in the electro-optical device according to the first embodiment, and causes the light-shielding film 200 and the upper-portion capacitor electrode 72 to be electrically connected to each other, is not provided. Further, the light-shielding film 200 is provided so as not to be overlapped by the contact hole 89.

In FIG. 9, in an electro-optical device according to this second embodiment, the contact hole 89 is not electrically connected to the light-shielding film 200, but is electrically connected to the upper-portion capacity electrode 72. That is, the constant electric potential, which is supplied from the fourth relay layer 94 to the upper-portion capacitor electrode 72 via the light-shielding film 200 in the case of the electro-optical device according to the first embodiment, is directly supplied from the fourth relay layer 94 to the upper-portion capacitor electrode 72.

In FIG. 8, in an electro-optical device according to this second embodiment, further, the light-shielding film 200 is electrically connected to the second relay layer 92 via a contact hole 260, which is formed so as to pass through the third interlayer insulating film 43. That is, the light-shielding film 200 is electrically connected to the pixel electrode side source drain area 1e of the semiconductor layer 1a, and the pixel electrode 9a. In other words, the light-shielding film 200 has an electric potential the same as that of the lower-portion capacitor electrode 71.

Owing to the above-described configuration, besides the storage capacitor 70, which is formed by the upper-portion capacitor electrode 72, the lower-portion capacitor electrode 71 and the dielectric film 75, it is possible to form a storage capacitor just like the storage capacitor 70 by the second interlayer insulating film 42 and the light-shielding film 200. Accordingly, it is possible to realize a significantly high-density storage capacitor.

Figure 10:
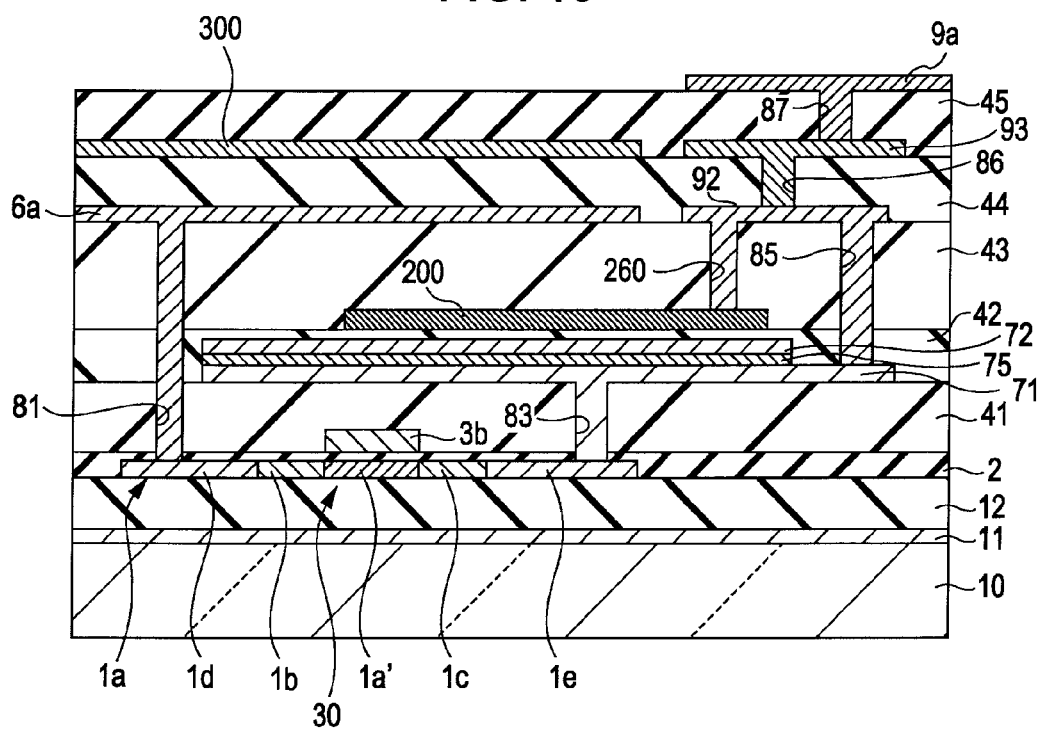
FIG. 10 is a cross-sectional view illustrating a modified example of an electro-optical device according to a second embodiment of the invention.

In FIG. 10, an electro-optical device according to this second embodiment can be configured by not providing the first relay layer 91 (refer to FIG. 8). That is, the lower-portion capacitor electrode 71 may be configured so as to be directly electrically connected to the second relay layer 92 via the contact hole 85. In this case, since it is unnecessary to provide the contact hole 84, which causes the lower-portion capacitor electrode 71 and the first relay layer 91 to be electrically connected to each other in the case of the electro-optical device according to the first embodiment, it is possible to realize a high yield rate and a narrow pixel pitch. In addition, such a configuration, in which the first relay layer 91 is not provided, can be applied to the above-described electro-optical device according to the first embodiment.

As described above, in an electro-optical device according to this second embodiment, since a storage capacitor can be formed by using the light-shielding film 200 as well, it is possible to achieve a high light-shielding capability, and further, form a high-density storage capacitor. Accordingly, it is possible to realize an electro-optical device having high reliability and being capable of displaying high-quality images.
Method for manufacturing an electro-optical device Next, a manufacturing method for manufacturing the above-described electro-optical device will be hereinafter described with reference to FIGS. 11 to 16. Here, FIGS. 11 to 16 are process cross-sectional views sequentially illustrating respective manufacturing processes with respect to an electro-optical device according to each of the embodiments of the invention. In addition, in the following description, only manufacturing processes with respect to respective members forming the storage capacitor 70, which is specific to the embodiments of the invention, will be described, and manufacturing processes with respect to members other than the storage capacitor 70 will be omitted from description.

Figure 11:
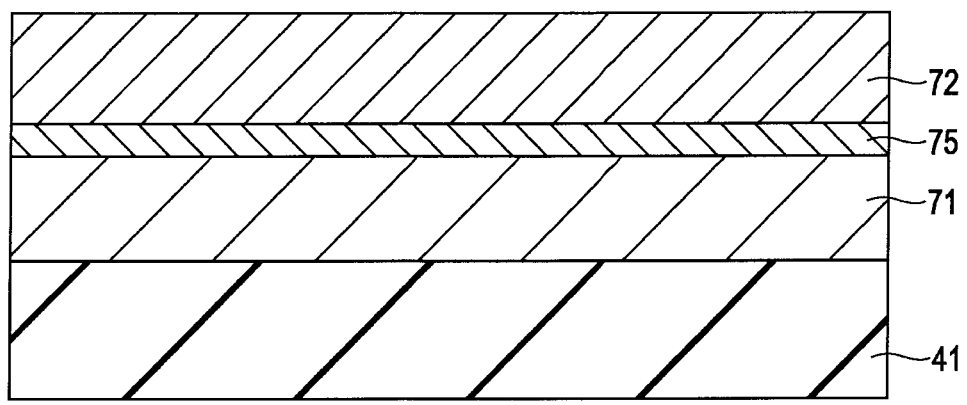
FIG. 11 is a first one of cross-sectional views sequentially illustrating respective manufacturing processes of an electro-optical device according to each of embodiments of the invention.

In FIG. 11, in manufacturing processes with respect to an electro-optical device according to each of embodiments of the invention, on the first interlayer insulating film 41, each of the lower-portion capacitor electrode 71, the dielectric film 75 and the upper-portion capacitor electrode 72, which form the storage capacitor 70, is sequentially laminated.

Figure 12:
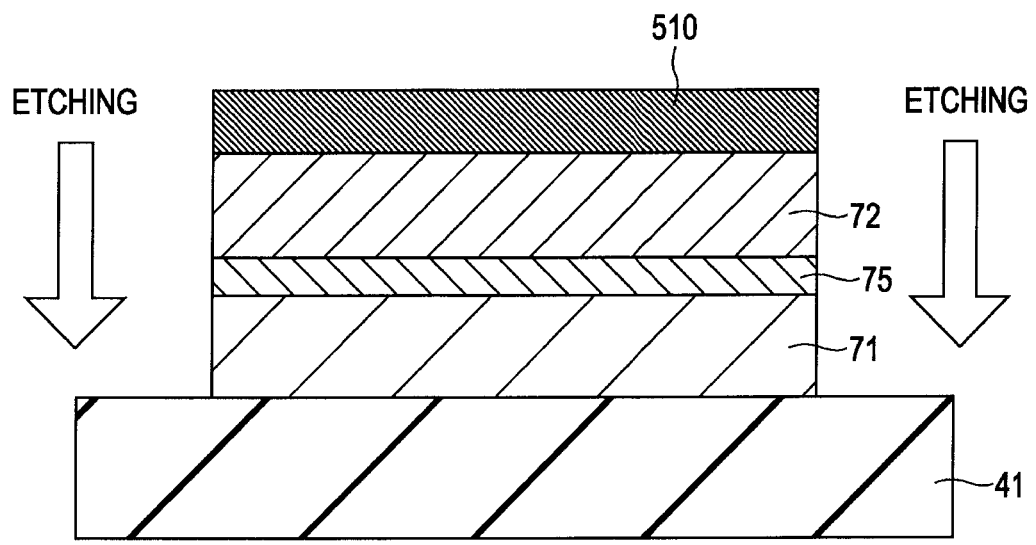
FIG. 12 is a second one of cross-sectional views sequentially illustrating respective manufacturing processes of an electro-optical device according to each of embodiments of the invention.

In FIG. 12, the lower-portion capacitor electrode 71, the dielectric film 75 and the upper-portion capacitor electrode 72 are subjected to a patterning process by performing etching using the same mask 510. That is, the lower-portion capacitor electrode 71, the dielectric film 75 and the upper-portion capacitor electrode 72 are subjected to a patterning process in block. As a result of this process, the lower-portion capacitor electrode 71, the dielectric film 75 and the upper-portion capacitor electrode 72 are formed in the same area with one another when viewed in a plan view.

Figure 13:
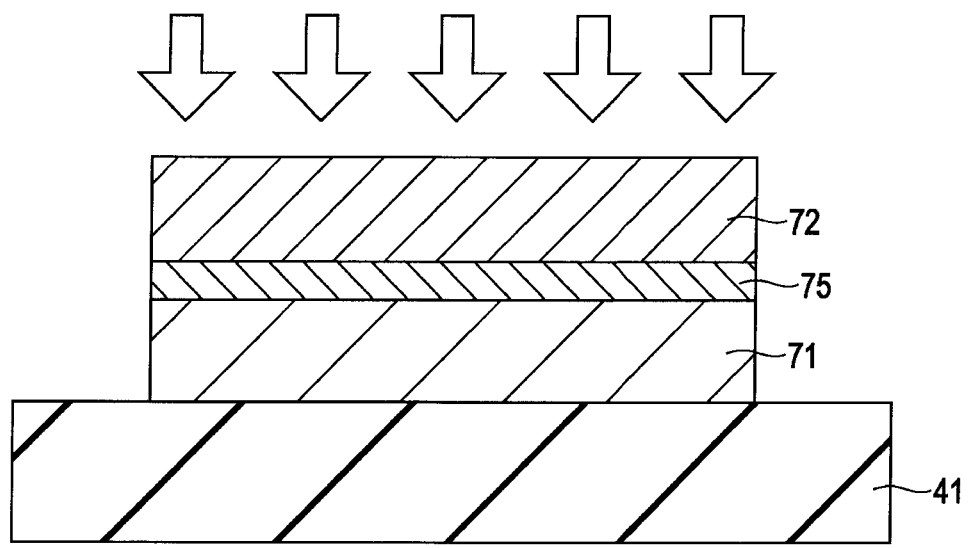
FIG. 13 is a third one of cross-sectional views sequentially illustrating respective manufacturing processes of an electro-optical device according to each of embodiments of the invention.

In FIG. 13, the lower-portion capacitor electrode 71, the dielectric film 75 and the upper-portion capacitor electrode 72 resulting from performing a patterning process are subjected to an oxidation process which is performed by, for example, applying heat. By performing such an oxidation process, an oxidized film is formed on the surface of the upper-portion capacitor electrode 72. That is, the surface of the upper-portion capacitor electrode 72 is in a partially oxidized condition. Owing to such processing, it is possible to enhance a pressure-withstanding capability of the storage capacitor 70.

Figure 14:
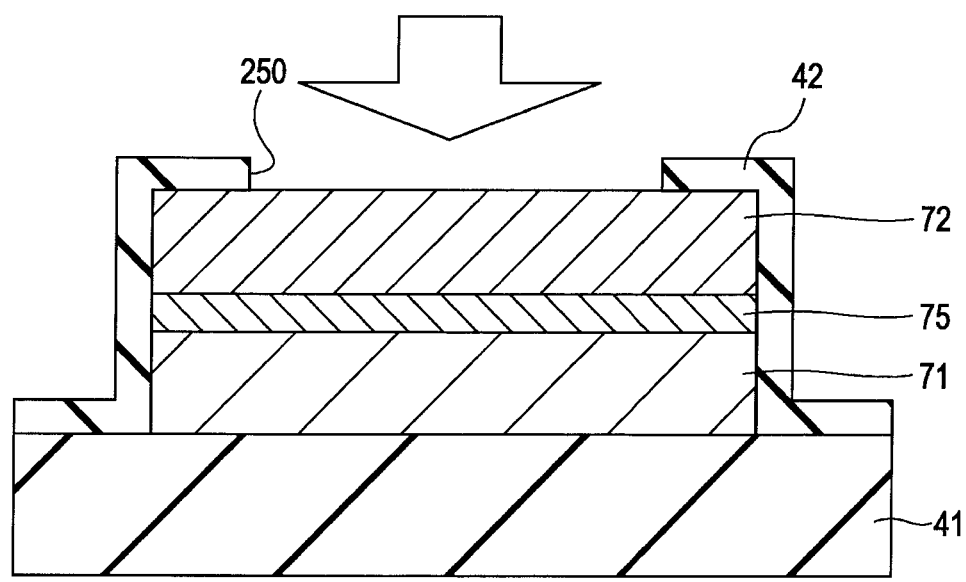
FIG. 14 is a fourth one of cross-sectional views sequentially illustrating respective manufacturing processes of an electro-optical device according to each of embodiments of the invention.

In FIG. 14, on the upper-portion capacitor electrode 72, the second interlayer insulating film 42 is formed. In the second interlayer insulating film 42, the contact hole 250 for causing the upper-portion capacitor electrode 72 and the light-shielding film 200 to be electrically connected to each other is formed. The contact hole 250 is formed so as to pass through the oxidized film having been formed on the surface of the upper-portion capacitor electrode 72. Therefore, Owing to this contact hole 250, it is possible to electrically connect the light-shielding film 200 and a non-oxidized portion of the upper-portion capacitor electrode 72. The contact hole 250 is formed in an area where the contact hole 250 is overlapped by the pixel electrode side LDD area 1c of the semiconductor layer 1a (refer to FIG. 4).

The second interlayer insulating film 42 is formed of a film having a thickness approximately the same as or thinner than that of the upper-portion capacitor electrode 72 or the light-shielding film 200 described below. Owing to this configuration, it is possible to form the light-shielding film 200 at the further lower side (in other words, at the TFT 30 side). Accordingly, it is possible to further enhance a capability of optically shielding the TFT 30.

Figure 15:
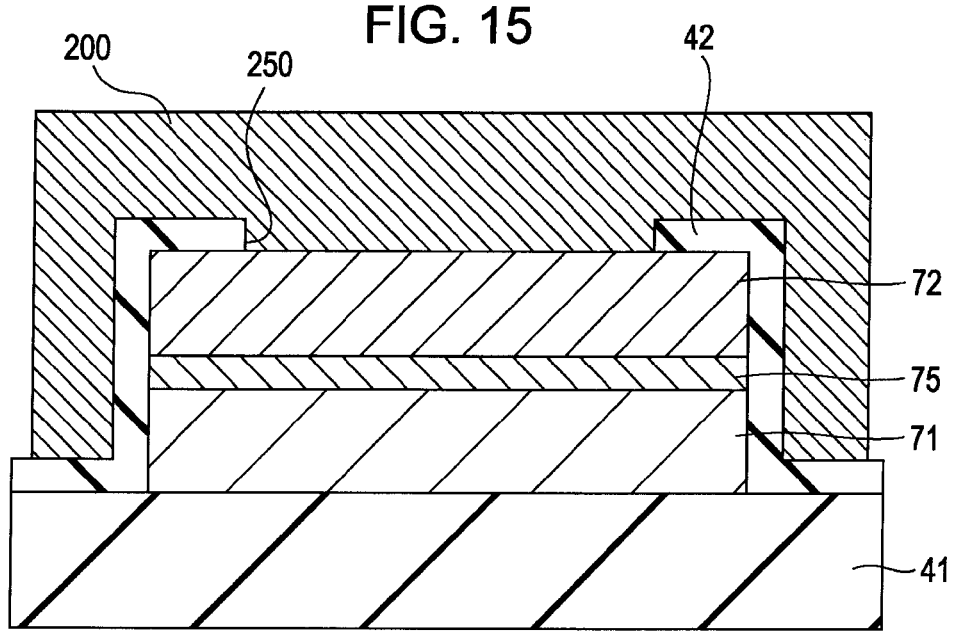
FIG. 15 is a fifth one of cross-sectional views sequentially illustrating respective manufacturing processes of an electro-optical device according to each of embodiments of the invention.

In FIG. 15, on the second interlayer insulating film 42, the light-shielding film 200 is formed. In such a manner, the light-shielding film 200 is formed subsequent to completion of the oxidation process performed on the lower-portion capacitor electrode 71, the dielectric film 75 and the upper-portion capacitor electrode 72. Therefore, the oxidation process on the light-shielding film 200 is not performed. Here, assuming that the oxidation process on a high melting point metal having a high light-shielding capability is performed, exposures on an oxidation processing device and cracks due to stress frequently occur, and such a situation is not preferable from a practical perspective. In contrast, forming the light-shielding film 200 subsequent to completion of the oxidation process in such a manner as that of this embodiment enables prevention of the above-described disadvantages from a practical perspective.

Figure 16:
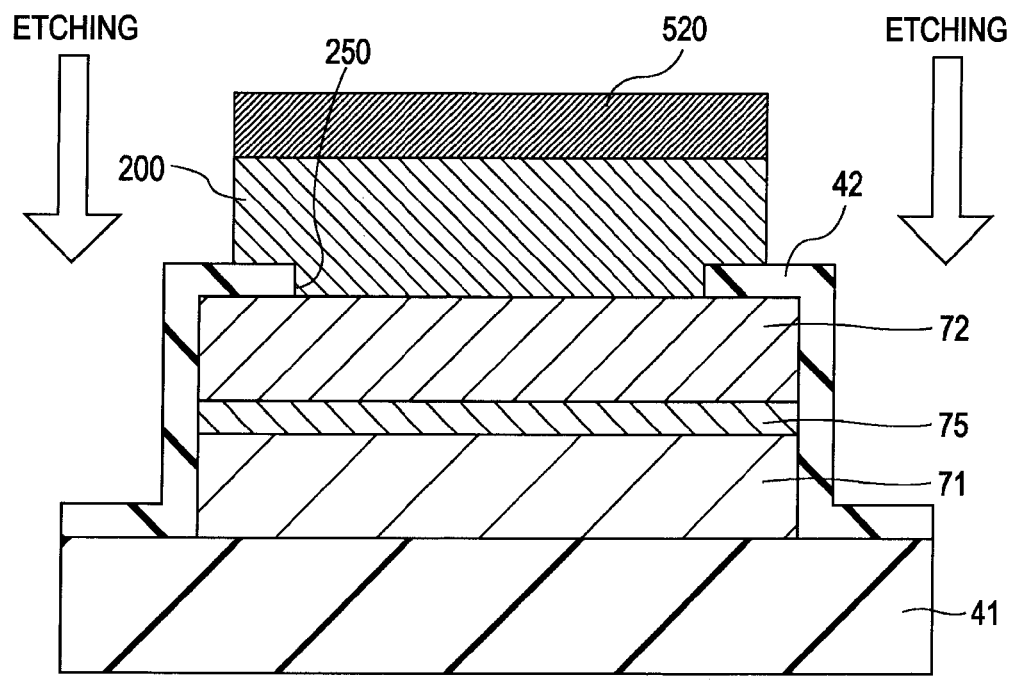
FIG. 16 is a sixth one of cross-sectional views sequentially illustrating respective manufacturing processes of an electro-optical device according to each of embodiments of the invention.

In FIG. 16, the light-shielding film 200 is subjected to a patterning process performed by executing etching using a mask 520. In this case, the light-shielding film 200 is formed in a scope smaller than that of each of the lower-portion capacitor electrode 71, the dielectric film 75 and the upper-portion capacitor electrode 72, which is a lower layer. In such a manner, it is possible to form the light-shielding film 200 relatively easier compared with a case in which the storage capacitor 70 is formed in a scope larger than that of each of the members forming the storage capacitor 70.

As described above, owing to a manufacturing method for manufacturing an electro-optical device according to this embodiment, it is possible to appropriately manufacture the above-described electro-optical device. In addition, here, a manufacturing method in the case where the upper-portion capacitor electrode 72 and the light-shielding film 200 are electrically connected to each other (i.e., in the case of the electro-optical device according to the first embodiment) has been described so far, but if processing is performed so that the contact hole 250 is not provided in the second interlayer insulating film 42, the manufacturing method is applied as a manufacturing method in the case where the upper-portion capacitor electrode 72 and the light-shielding film 200 are not electrically connected to each other (i.e., in the case of the electro-optical device according to the second embodiment).
Electronic Apparatus Next, a case, in which a liquid crystal device, which is the above-described electro-optical device, is applied to various electronic apparatuss, will be hereinafter described. Here, FIG. 17 is a plan view illustrating an example of a configuration of a projector. Hereinafter, a projector, in which such a liquid crystal device is used as a light valve, will be described.

As shown in FIG. 17, a lamp unit 1102 including a white color light source, such as a halogen lamp, is provided inside a projector 1100. Projection light rays radiating from this lamp unit 1102 is separated into three primary colors, i.e., RGB by four mirrors 1106 and two dichroic mirrors 1108 that are allocated inside a light guide 1104, and the separated light rays are inputted to respective liquid crystal panels 1110R, 1110B and 1110G functioning as light valves corresponding to the respective three primary colors.

The liquid crystal panels 1110R, 1110B and 1110G are each configured in the same manner as or in a manner similar to that of the above-described liquid crystal device, and are driven by the respective primary color signals, i.e., R, G and B color signals, which are supplied from an image signal processing circuit. Further, light rays modulated by these liquid crystal panels are inputted to a dichroic prism 1112 from three directions. In this dichroic prism 1112, each of R and B light rays is refracted to a right angle; whilst G light rays go straight. Therefore, as a result of combining images of the respective colors, via a projection lens 1114, color images are projected on a screen and the like.

Here, focusing on display images displayed by the respective liquid crystal panels 1110R, 1110B and 1110G, display images displayed by the liquid crystal panel 1110G are required to be mirror reversed relative to display images displayed by each of the liquid crystal panels 1110R and 1110B.

In addition, since light rays corresponding to the respective primary colors of R, G and B are inputted to the liquid crystal panels 1110R, 1110B and 1110G by the dichroic mirror 1108, no color filter needs to be provided.

It is to be noted that, in addition to the electronic apparatus having been described with reference to FIG. 17, there are electronic devices, such as a mobile personal computer, a mobile-phone, a liquid crystal television, a viewfinder-type or a direct-view-type video tape recorder, a car navigation device, a pager, a personal organizer, an electronic calculator, a word processor, a workstation, a video telephone, a POS terminal, devices provided with a touch panel. Further, needless to say, some aspects of the invention can be applied to these various electronic apparatuses.

Moreover, some aspects of the invention can be applied to a reflective liquid crystal device (LCOS), a plasma display (PDP), a field emission display (FED, SED), an organic EL display, a digital micromirror device (DMD), an electrophoretic device and the like, in addition to the liquid crystal device having been described in the above embodiments.

The invention is not limited to the above-described embodiments, but can be appropriately modified within a scope not departing from the gist or the concept of the invention, which can be read from the appended claims and the whole specification. Further, the technical scope of the invention also encompasses such an electro-optical device with modifications, an electronic apparatus provided with the electro-optical device and a manufacturing method for manufacturing the electro-optical device.

The entire disclosure of Japanese Patent Application No. 2010-052938, filed Mar. 10, 2010 is expressly incorporated by reference herein.

What is claimed is:

1. An electro-optical device comprising:
   a substrate;
   a pixel electrode corresponding to a pixel on the substrate;
   a transistor provided between the substrate and the pixel electrode, the transistor having a semiconductor layer, a gate electrode, and an LDD structure;
   a first capacitor electrode provided between the pixel electrode and the transistor, the first capacitor electrode being electrically connected to the pixel electrode and the transistor;
   a second capacitor electrode provided between the pixel electrode and the first capacitor electrode, the second capacitor electrode being located so as to be opposite the first capacitor electrode via a capacitor insulating film, and the second capacitor electrode configured to be supplied with a predetermined electric potential;
   a light-shielding film provided between the pixel electrode and the second capacitor electrode, the light-shielding film being located so as to be at least partially overlapped by the semiconductor layer, and the light-shielding film being electrically connected to the second capacitor electrode via a contact hole formed in an insulating film disposed between the second capacitor electrode and the light-shielding film, wherein the second capacitor electrode and the light-shielding film are electrically connected to each other via the contact hole that is at least partially overlapped with an LDD area positioned at the pixel electrode side; and
   a capacitor line provided between the pixel electrode and the light-shielding film, the light-shielding film configured to be supplied with a predetermined electric potential via the capacitor line.

2. The electro-optical device according to claim 1, wherein the light-shielding film is provided within an area of the second capacitor electrode when viewed in a plan view.

3. The electro-optical device according to claim 1, wherein an oxidized film is formed on a surface of the second capacitor electrode.

4. The electro-optical device according to claim 1, wherein the predetermined electric potential is an opposite common electric potential, which is configured to be supplied to an opposite electrode that is located so as to be opposite the pixel electrode via an electro-optical material.

5. The electro-optical device according to claim 1, wherein the first capacitor electrode is electrically connected to the pixel electrode via a relay layer, which is provided on a layer the same as that of a gate electrode of the transistor.

6. An electronic apparatus comprising an electro-optical device set forth in claim 1.

7. An electro-optical device comprising:
   a substrate;
   a pixel electrode corresponding to a pixel on the substrate;
   a transistor provided between the substrate and the pixel electrode, the transistor having a semiconductor layer and a gate electrode;
   a first capacitor electrode provided between the pixel electrode and the transistor, the first capacitor electrode being electrically connected to the pixel electrode and the transistor;
   a second capacitor electrode provided between the pixel electrode and the first capacitor electrode, the second capacitor electrode being located so as to be opposite the first capacitor electrode via a first capacitor insulating film, and the second capacitor electrode configured to be supplied with a predetermined electric potential;

a light-shielding film provided between the pixel electrode and the second capacitor electrode, the light-shielding film being located so as to be at least partially overlapped by the semiconductor layer and so as to be opposite the second capacitor electrode via a second capacitor insulating film, and the light-shielding film being electrically connected to the pixel electrode via a contact hole formed in an insulating film disposed between the pixel electrode and the light-shielding film; and a capacitor line provided between the pixel electrode and the second capacitor electrode, the second capacitor electrode configured to be supplied with the predetermined electric potential via the capacitor line.

8. An electronic apparatus comprising an electro-optical device set forth in claim 7.

9. An electro optical device comprising:

a substrate;

a pixel electrode;

a transistor electrically connected to the pixel electrode, the transistor having a semiconductor layer and a gate electrode;

a capacitor electrically connected to the pixel electrode, the capacitor including a first capacitor electrode that is electrically connected to the pixel electrode, a second capacitor electrode that is disposed between the pixel electrode and the first capacitor electrode, a capacitor insulating film disposed between the first capacitor electrode and the second capacitor electrode;

a light shielding film that is disposed between the pixel electrode and the second capacitor electrode, the light shielding film overlapping at least a part of the semiconductor layer when looking from a direction from the pixel electrode toward the substrate, the light shielding film is separated from the second capacitor electrode by a second capacitor insulating film, the light shielding film being electrically connecting to the pixel electrode; and a capacitor line disposed between the pixel electrode and the second capacitor electrode.

* * * * *